(12) United States Patent
Tran

(10) Patent No.: US 7,759,146 B2
(45) Date of Patent: Jul. 20, 2010

(54) METHOD OF MAKING HIGH EFFICIENCY UV VLED ON METAL SUBSTRATE

(75) Inventor: Chuong Anh Tran, Hsinchu County (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 362 days.

(21) Appl. No.: 11/744,717

(22) Filed: May 4, 2007

(65) Prior Publication Data
US 2008/0274572 A1 Nov. 6, 2008

(51) Int. Cl.
*H01L 21/00* (2006.01)
*H01L 33/00* (2010.01)
*H01L 31/072* (2006.01)

(52) U.S. Cl. .............. 438/29; 257/98; 257/22

(58) Field of Classification Search ............. 257/13–22, 257/96–103, E33.068, E33.056–E33.059, 257/E51.004–E51.052; 438/22–38
See application file for complete search history.

(56) References Cited

U.S. PATENT DOCUMENTS

| | | | |
|---|---|---|---|
| 4,913,789 A | 4/1990 | Aung | |
| 6,784,010 B2 * | 8/2004 | Yamaguchi et al. | 438/39 |
| 7,148,520 B2 * | 12/2006 | Yoo | 257/98 |
| 7,452,739 B2 * | 11/2008 | Chu et al. | 438/33 |
| 2003/0080344 A1 * | 5/2003 | Yoo | 257/103 |
| 2006/0154392 A1 | 7/2006 | Tran et al. | |
| 2006/0225644 A1 * | 10/2006 | Lee et al. | 117/89 |
| 2007/0057273 A1 | 3/2007 | Yoo | |

OTHER PUBLICATIONS

M. Asif Khan et al., "III-Nitride UV Devices," The Japan Society of Applied Physics, 2005 vol. 44(10): pp. 7191-7206.
Z. Gong et al., "Optical power degradation mechanisms in AlGaN-based 280 nm deep ultraviolet light-emitting diodes on sapphire," Applied Physics Letters, 2006 vol. 88: pp. 121106-1-121106-3.
PCT International Search Report and Written Opinion dated Sep. 5, 2008.

* cited by examiner

*Primary Examiner*—Calvin Lee
(74) *Attorney, Agent, or Firm*—Patterson & Sheridan, LLP

(57) ABSTRACT

A method of fabricating ultraviolet (UV) vertical light-emitting diode (VLED) structures composed of AlInGaN or AlGaN with increased crystalline quality and a faster growth rate when compared to conventional AlInGaN or AlGaN LED structures is provided. This may be accomplished by forming a sacrificial GaN layer above a carrier substrate, and then depositing the light-emitting diode (LED) stack above the sacrificial GaN layer. The sacrificial GaN layer may then be removed in subsequent processing steps.

20 Claims, 4 Drawing Sheets

METHOD OF MAKING HIGH EFFICIENCY UV VLED ON METAL SUBSTRATE

BACKGROUND OF THE INVENTION

1. Field of the Invention

Embodiments of the present invention generally relate to the field of light-emitting diode (LED) technology and, more particularly, to a vertical light-emitting diode (VLED) structure.

2. Description of the Related Art

LEDs have been around for several decades, and research and development efforts are constantly being directed towards improving their luminous efficiency, thereby increasing the number of possible applications. To fabricate LEDs emitting near to far ultraviolet (UV) light, semiconductor layers comprising aluminum gallium nitride (AlGaN) or aluminum indium gallium nitride (AlInGaN) are typically epitaxially grown directly on a sapphire substrate using metal organic chemical vapor deposition (MOCVD). Such UV LEDs generally have an emission wavelength shorter than the energy bandgap of GaN (approximately 365 nm at room temperature). Therefore, a semiconductor layer of gallium nitride (GaN) is most likely not present outside the active layer(s) in the UV LED structure; otherwise, the emitted light would be absorbed by the GaN layer(s), resulting in a significant or total loss of efficiency.

However, the layer growth rate of AlGaN and AlInGaN is very slow, especially with high aluminum (Al) content, due to trimethylaluminum ($Al(CH_3)_3$)-ammonia ($TMA-NH_3$) adduct formation. In addition, a thick AlGaN or AlInGaN layer will often crack, thereby limiting the thickness of the semiconductor layers in the LED stack. The stress experienced by an AlInGaN or AlGaN layer is proportional to the Al content in the layer, so the higher the Al content, the more likely it is for the AlGaN or AlInGaN layer of a given thickness to crack. For example, an AlGaN layer directly grown on sapphire with 20% Al and a thickness of 0.4 μm has been observed to develop very poor morphology with microcracking along certain preferential crystallographic directions.

Moreover, the dislocation density for AlInGaN or AlGaN layers grown directly on a sapphire substrate may be unacceptable for a desired level of performance from a UV LED. The dislocation density is a measure of how many lattice imperfections (due to the lattice mismatch between sapphire and AlGaN or AlInGaN) are present in a crystal structure of a particular volume. Since a dislocation is a line, loop, or point defect, the dislocation density is defined as the total number of defects or imperfections due to lattice mismatch per unit volume and may be expressed in units of number of dislocations/$cm^3$. These lattice imperfections, or dislocations, may have a profound limiting effect on light emission efficiency from the LED.

Accordingly, what is needed are improved techniques to fabricate UV LEDs.

SUMMARY OF THE INVENTION

Embodiments of the present invention generally provide techniques for fabricating vertical light-emitting diode (VLED) structures composed of AlInGaN or AlGaN with increased crystalline quality and a faster growth rate when compared to conventional AlInGaN or AlGaN LED structures.

One embodiment of the present invention is a method of fabricating a VLED structure. The method generally includes growing a sacrificial GaN layer above a sapphire substrate; forming a light-emitting diode (LED) stack comprising at least one of AlInGaN and AlGaN above the sacrificial GaN layer; depositing one or more layers of a metal substrate above the LED stack; removing the sapphire substrate; and removing the sacrificial GaN layer.

Another embodiment of the present invention is a method of fabricating a VLED structure. The method generally includes growing a sacrificial GaN layer above a sapphire substrate; forming an n-doped layer above the sacrificial GaN layer; forming an active layer above the n-doped layer; forming a p-doped layer above the active layer, wherein the n-doped layer, the active layer, and the p-doped layer comprise at least one of AlInGaN and AlGaN above the sacrificial GaN layer; depositing one or more layers of a metal substrate above the p-doped layer; removing the sapphire substrate; and removing the sacrificial GaN layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide techniques for fabricating ultraviolet (UV) vertical light-emitting diode (VLED) structures composed of AlInGaN or AlGaN with increased crystalline quality and a faster growth rate when compared to conventional AlInGaN or AlGaN LED structures. This may be accomplished by forming a sacrificial GaN layer above a carrier substrate, and then depositing the light-emitting diode (LED) stack above the sacrificial GaN layer.

An Exemplary VLED Fabrication Method

Figure 1:
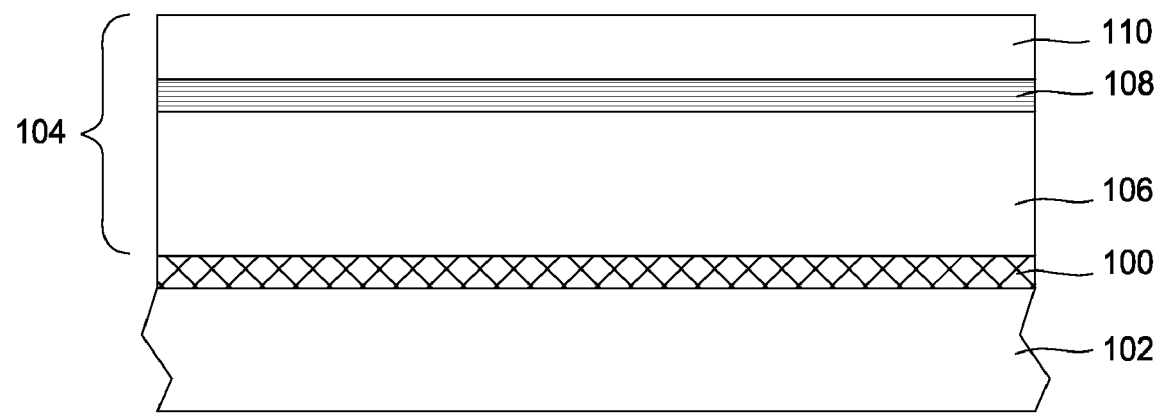
FIG. 1 is a cross-sectional schematic representation of a light-emitting diode (LED) stack deposited on a sacrificial GaN layer, which is, in turn, formed on a carrier substrate in accordance with an embodiment of the invention.

Referring now to FIG. 1, a sacrificial GaN layer 100 may be deposited on a carrier substrate 102 employing various techniques known to those skilled in the art, such as metalorganic chemical vapor deposition (MOCVD), molecular beam epitaxy (MBE), and hydride vapor phase epitaxy (HVPE). Being an n-doped, p-doped, or undoped layer, the thickness of the sacrificial GaN layer 100 may range from about 10 nm to 10 μm. A doped sacrificial GaN layer 100 may be doped with silicon, magnesium, or zinc, for example. The carrier substrate 102 may comprise any suitable material for supporting the growth of GaN, such as sapphire.

A multilayer epitaxial LED stack 104 may be grown above the sacrificial GaN layer 100. The LED stack 104 may comprise an n-doped layer 106 grown on the sacrificial GaN layer 100, a multiple quantum well active layer 108 disposed above the n-doped layer 106, and a p-doped layer 110 formed above the active layer 108 as shown in FIG. 1. The inclusion of a sacrificial GaN layer 100 may allow for an undoped or doped layer to be grown directly on the carrier substrate 102. Proper selection between dopants within the n-doped layer 106 or a lack thereof in an undoped layer, respectively, as the first layer grown above the sacrificial GaN layer 100 may provide for improved crystalline quality in the remainder of the LED stack 104.

The active layer 108 may comprise one or more layers of AlInGaN or AlGaN for emitting light having wavelengths in the near to far ultraviolet (UV) range (i.e., shorter than 365 nm) when forward biased through the radiative recombination of holes and electrons. For some embodiments, the active layer 108 may also comprise very thin (e.g., less then 4 nm thick) GaN layers in the form of quantum wells in addition to the AlInGaN or AlGaN layers, which may lead to lower defect density in the active layer 108 and increased luminous intensity.

Composed of AlInGaN or AlGaN, the n-doped layer 106 may be grown above the sacrificial GaN layer 100 at a faster rate and with a lower lattice mismatch when compared to conventional UV LEDs grown directly on sapphire or another carrier substrate. This phenomenon may be due to the closer lattice match between AlInGaN (or AlGaN) and GaN than between AlInGaN (or AlGaN) and sapphire, for example. The increased crystalline quality may result in lower dislocation density in the LED stack 104, leading to increased brightness and hence, greater luminous efficiency in the VLED structure eventually produced. For some embodiments, an undoped layer (not shown) may be grown directly on the sacrificial GaN layer at a faster growth rate followed by the n-doped layer 106 and exhibit the increased crystalline quality when compared to conventional UV LEDs, as well. The p-doped layer 110 may also comprise AlInGaN or AlGaN in an effort to maintain a diminutive lattice mismatch from the sacrificial GaN layer 100 through the layers of the LED stack 104.

Figure 2:
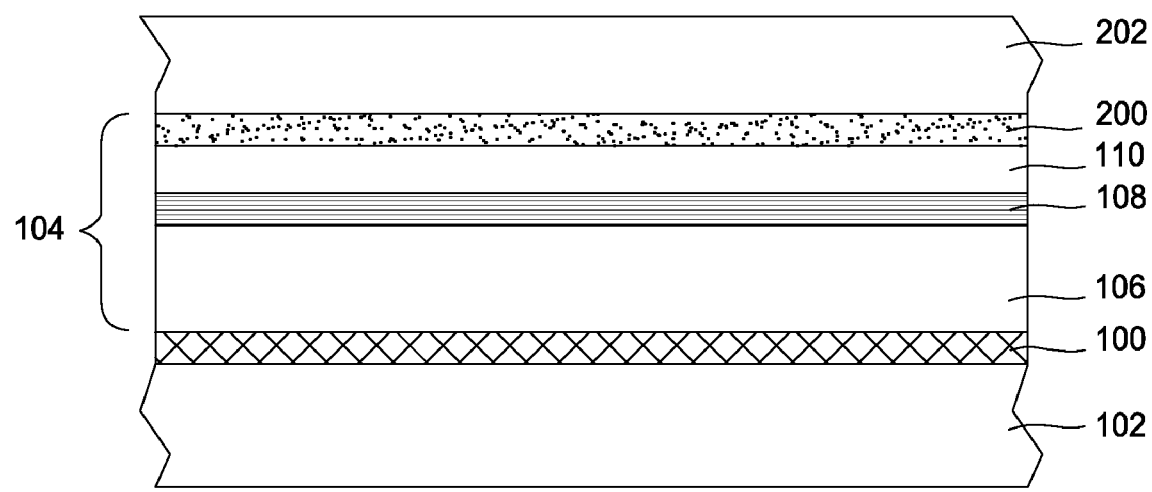
FIG. 2 illustrates adding a reflective layer and depositing a metal substrate to the structure of FIG. 1 in accordance with an embodiment of the invention.

Above the p-doped layer 110, a reflective layer 200 may be formed as illustrated in FIG. 2. The reflective layer 200 may comprise any suitable material for conducting electrical current and reflecting light, such as a metal or metal alloy of Al, Ag, Au, AgNi, Ni/Ag/Ni/Au, Ag/Ni/Au, Ag/Ti/Ni/Au, Ti/Al, and Ni/Al. The reflective layer 200 may reflect light emitted from the active layer 108 in an effort to redirect the light towards the intended emitting surface (i.e., the surface of the n-doped layer 106) of the VLED structure.

In an effort to enhance this reflectivity and allow more light to escape from the emitting surface, a conductive transparent layer (not shown) may be formed for some embodiments above the LED stack 104 before the reflective layer 200 is constructed. The conductive transparent layer may comprise any suitable material capable of conducting electrical current and allowing light transmission, such as indium tin oxide (ITO) or a combination of complex structures called an omnidirectional reflector (ODR). Able to reflect light in all directions, an ODR may have high reflectivity and a wide stop band, thereby leading to greater LED light extraction than achievable with metal reflectors and distributed Bragg reflectors (DBRs) as described in U.S. patent application Ser. No. 11/682,780, entitled "Vertical Light-Emitting Diode Structure with Omni-Directional Reflector" and filed Mar. 6, 2007, herein incorporated by reference.

One or more layers of a metal substrate 202 may be deposited above the reflective layer 200. Serving to conduct electrical current and dissipate heat away from the p-n junction, the metal substrate 202 may comprise a metal or metal alloy of elements such as Cu, Ni, Au, Ag, Co, Pd, Pt, W, Cr, or Ti and have a thickness greater than 25 µm. Individual layers of the metal substrate 202 may comprise different materials, and the layers may be deposited using any suitable technique, such as electrochemical deposition (ECD), electroless chemical deposition (ElessCD), chemical vapor deposition (CVD), plasma-enhanced chemical vapor deposition (PECVD), physical vapor deposition (PVD), evaporation, or a plasma spray technique. For some embodiments, a seed metal layer (not shown) may be deposited by electroless plating, for example, and then additional layers of the metal substrate 202 may be electroplated on the seed metal layer. The reflective layer 200 may also function as the seed metal layer for some embodiments.

Figure 3:
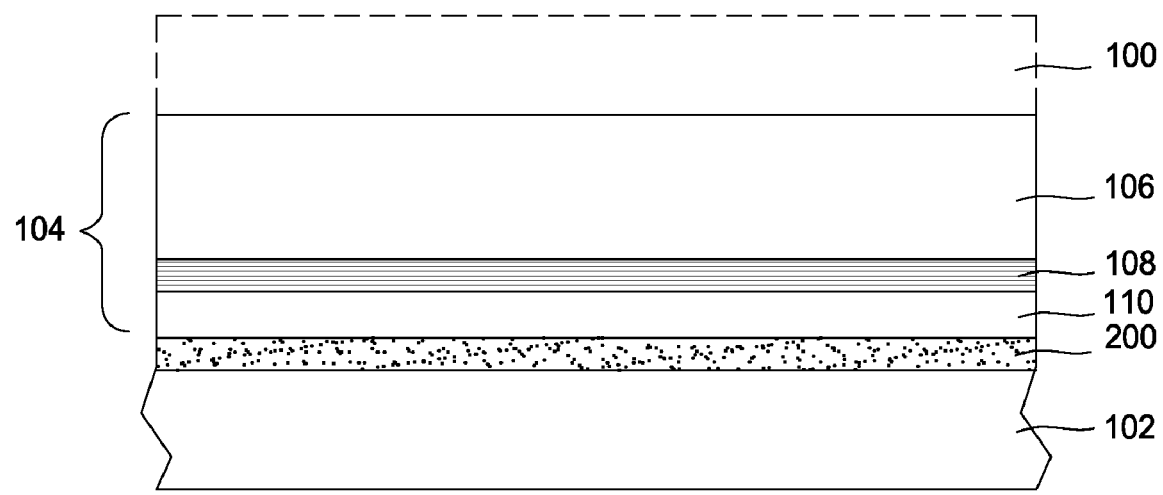
FIG. 3 portrays removing the carrier substrate and the sacrificial GaN layer from the structure of FIG. 2 in accordance with an embodiment of the invention.

Referring now to FIG. 3, the carrier substrate 102 may be removed, followed by removal of the sacrificial GaN layer 100. The carrier substrate 102 may be removed by any suitable technique, such as pulsed laser irradiation, chemical mechanical polishing (CMP), wet etching, and selected photoenhanced chemical etching. As these methods are well-known to those skilled in the art, they will not be described further herein. Removal of the carrier substrate 102 may expose the sacrificial GaN layer 100. Although the VLED would most likely emit some light with the LED stack 104 covered by the sacrificial GaN layer 100, GaN may act as a strong light absorber for wavelengths shorter than about 365 nm emitted by the UV-light-producing active layer 108 leading to undesirable light loss and an inefficient VLED. This absorption may occur because the GaN bandgap has lower energy than photons having wavelengths shorter than 365 nm. Therefore, the sacrificial GaN layer may be removed by any suitable technique, such as wet etching, dry etching, mechanical polishing, and chemical mechanical polishing (CMP), to expose the n-doped layer 106.

Furthermore, because of the absorption by GaN for an LED stack 104 emitting near to far ultraviolet light, the layers of the LED stack 104 other than the active layer 108 may most likely not contain GaN. As described above, the active layer 108 composed of AlGaN or AlInGaN may also comprise GaN in quantum wells for some embodiments, which may lead to lower defect density in the active layer 108 and increased luminous intensity.

Figure 4:
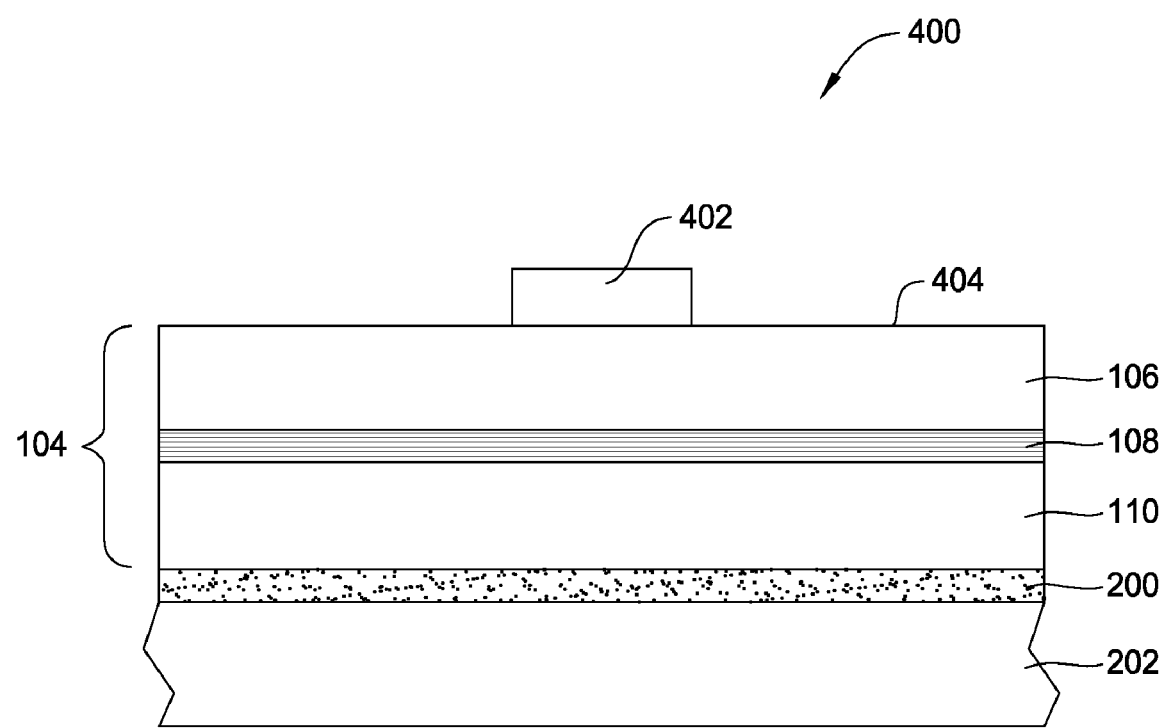
FIG. 4 depicts adding an n-electrode to the structure of FIG. 3 in accordance with an embodiment of the invention.

Referring now to the functional VLED structure 400 in FIG. 4, a contact pad 402 for external connection may be coupled to the n-doped layer 106. For some embodiments, the emitting surface 404 of the n-doped layer 106 may be roughened or textured in an effort to enhance light emission from the VLED structure 400.

While the foregoing is directed to embodiments of the present invention, other and further embodiments of the invention may be devised without departing from the basic scope thereof, and the scope thereof is determined by the claims that follow.

The invention claimed is:

1. A method of fabricating a vertical light-emitting diode (VLED) structure, comprising:
   growing a sacrificial GaN layer above a sapphire substrate, wherein the sacrificial GaN layer is doped with at least one of magnesium, silicon, and zinc;
   forming a light-emitting diode (LED) stack comprising at least one of AlInGaN and AlGaN above the sacrificial GaN layer;

depositing one or more layers of a metal substrate above the LED stack;

removing the sapphire substrate; and removing the sacrificial GaN layer.

2. The method of claim 1, wherein the sacrificial GaN layer has a thickness between 10 nm and 10μm.

3. The method of claim 1, wherein a layer of the LED stack adjacent to the sacrificial GaN layer is an undoped layer.

4. The method of claim 1, wherein the metal substrate comprises at least one of Cu, Ni, Au, Ag, Co, Pd, Pt, W, Cr, Ti, or alloys thereof.

5. The method of claim 1, wherein the metal substrate comprises more than one layer.

6. The method of claim 1, wherein the metal substrate has a thickness greater than 25μm.

7. The method of claim 1, wherein depositing the one or more layers of the metal substrate comprises at least one of electrochemical deposition (ECD), electroless chemical deposition (ElessCD), chemical vapor deposition (CVD), plasma-enhanced chemical vapor deposition (PECVD), physical vapor deposition (PVD), evaporation, or a plasma spray technique.

8. The method of claim 1, further comprising disposing a reflective layer between the LED stack and the metal substrate.

9. The method of claim 8, further comprising disposing a conductive transparent layer between the LED stack and the reflective layer.

10. The method of claim 1, wherein removing the sapphire substrate comprises at least one of pulsed laser irradiation, chemical mechanical polishing (CMP), wet etching, and selected photoenhanced chemical etching.

11. The method of claim 1, wherein removing the sacrificial GaN layer comprises at least one of wet etching, dry etching, mechanical polishing, and chemical mechanical polishing (CMP).

12. The method of claim 1, further comprising forming an electrode coupled to the exposed LED stack after removing the sacrificial GaN layer.

13. A method of fabricating a vertical light-emitting diode (VLED) structure, comprising:

growing a sacrificial GaN layer above a sapphire substrate, wherein the sacrificial GaN layer is doped with at least one of magnesium, silicon, and zinc;

forming an n-doped layer above the sacrificial GaN layer;

forming an active layer above the n-doped layer;

forming a p-doped layer above the active layer, wherein the n-doped layer, the active layer, and the p-doped layer comprise at least one of AlInGaN and AlGaN above the sacrificial GaN layer;

depositing one or more layers of a metal substrate above the p-doped layer;

removing the sapphire substrate; and removing the sacrificial GaN layer.

14. The method of claim 13, wherein the sacrificial GaN layer has a thickness between 10 nm and 10μm.

15. The method of claim 13, wherein the metal substrate comprises at least one of Cu, Ni, Au, Ag, Co, Pd, Pt, W, Cr, Ti, or alloys thereof.

16. The method of claim 13, wherein depositing the one or more layers of the metal substrate comprises at least one of electrochemical deposition (ECD), electroless chemical deposition (ElessCD), chemical vapor deposition (CVD), plasma-enhanced chemical vapor deposition (PECVD), physical vapor deposition (PVD), evaporation, and a plasma spray technique.

17. The method of claim 13, further comprising disposing a reflective layer between the p-doped layer and the metal substrate.

18. The method of claim 17, further comprising disposing a conductive transparent layer between the p-doped layer and the reflective layer.

19. The method of claim 13, wherein removing the sacrificial GaN layer comprises at least one of wet etching, dry etching, mechanical polishing, and chemical mechanical polishing (CMP).

20. The method of claim 13, wherein neither the p-doped layer nor the n-doped layer comprises GaN.

* * * * *